INVENTOR
JOHN M. S. NEILSON
BY M. Y. Epstein
ATTORNEY

INVENTOR
JOHN M. S. NEILSON
BY M. Y. Epstein
ATTORNEY

INVENTOR
JOHN M. S. NEILSON
BY M. Y. Epstein
ATTORNEY

United States Patent Office 3,553,536
Patented Jan. 5, 1971

3,553,536

SEMICONDUCTOR RECTIFIERS HAVING CONTROLLED STORAGE AND RECOVERY CHARACTERISTICS

John M. S. Neilson, Mountaintop, Pa., assignor to RCA Corporation, a corporation of Delaware Filed Nov. 19, 1968, Ser. No. 776,991
Int. Cl. H01l 3/00
U.S. Cl. 317—235 8 Claims

ABSTRACT OF THE DISCLOSURE

In semiconductor rectifiers comprising two heavily doped regions of N and P conductivity contiguous to and separated by a base region, different rectifiers having various combinations of storage time and switching recovery rate are obtained by various combinations of certain ones of the physical parameters of the devices, such as the doping concentrations at the junctions of the device, the type and resistivity of the base region, and the use of carrier lifetime reducing doping materials.

BACKGROUND OF THE INVENTION

This invention relates to semiconductor devices, and particularly to semiconductor rectifier diodes.

Of interest in the use of semiconductor rectifier diodes in the manner in which the diodes switch from the forward biased conducting state to the reverse biased blocking state.

During forward conduction of a semiconductor diode, large numbers of charge carriers are injected, owing to the forward bias voltage across the diode, from portion to portion of the diode. At the instant the diode is first switched from its forward biased conducting state to its reversed biased state, the charge carriers reverse direction of this effective movement and allow a reverse current to flow through the diode for a short period of time. As the various portions of the diode become depleted of these injected carriers, the reverse current begins to decrease towards the normal leakage current through the diode and the diode begins to exhibit a blocking characteristic. The time during which reverse current flows and the diode exhibits no blocking characteristic is known as the storage time of the diode.

Certain circuit applications exist wherein longer or shorter diode storage times are desired for the purpose of protecting other components in the circuit.

The rate at which the reverse current decreases is referred to as the "recovery rate" of the diode. In some circuit applications, a fast reverse current decay, or a "snap" recovery characteristic, is preferred since, for example, the rapid change of current can be used to generate high frequency signals. In other applications, however, the high frequency signals consitute an unwanted source of noise, and a slow reverse current decay, or a "soft" recovery characteristic, is desired.

SUMMARY OF THE INVENTION

A semiconductor diode is provided comprising a pellet of semiconductor material, such as silicon, containing two heavily doped regions of N and P conductivity type contiguous to and separated by a base region. As described hereinafter, the base can be of lightly doped N conductivity type, providing the pellet with a rectifying PN junction and a non-rectifying or ohmic $N+N$ junction; or the base can be of lightly doped P conductivity type, providing the pellet with a rectifying NP junction and an ohmic $P+P$ junction; or the base can be intrinsic, providing the pellet with a PI junction and an NI junction.

For the purpose of obtaining soft recovery characteristics in diode pellets of the type described, one or more of the following design parameters are used: high doping concentrations close to the rectifying junctions of either the P or N type base pellets, and close to either or both the PI or NI junctions of the intrinsic base pellet; low doping concentrations close to the ohmic junctions of the P or N type base pellets, and at either the PI or NI junctions of the intrinsic type pellet; comparatively low resistivity of he N type bases; and doping with a material such as gold, platinum, or the like, for reducing the lifetime of the charge carriers adjacent to the PN junction of the P or N type base pellets.

For the purpose of obtaining snap recovery characteristics in diode pellets of the type described, one or more of the following parameters are used: low doping concentrations close to the rectifying and either or both the PI and NI junctions; high doping concentrations close to the ohmic junctions; high base resistivity of the N type bases; and charge carrier lifetime reducing doping of the regions adjacent to the ohmic junctions.

As described hereinafter, the above parameters also affect the storage time of the device. By proper selection of the parameters, diodes having various combinations of storage characteristics and recovery rates can be provided.

DESCRIPTION OF THE PREFERRED EMBODIMENTS

Figure 1:
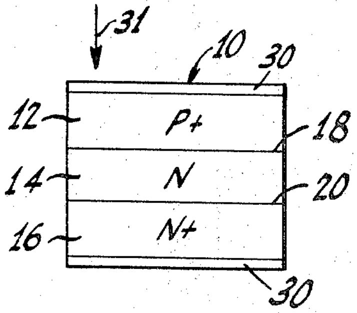
FIGS. 1, 2, and 3 are side views of three embodiments of semiconductor diode pellets.

With reference to FIG. 1, a semiconductor pellet 10 is shown which contains a highly doped region 12 of P conductivity type (i.e., a P+ region), a lightly doped base region 14 of N type conductivity, and a highly doped region 16 of N conductivity type, (i.e., an N+ region). Two junctions are present in the device, a $P+N$ junction 18, and an $N+N$ junction 20.

Figure 2:
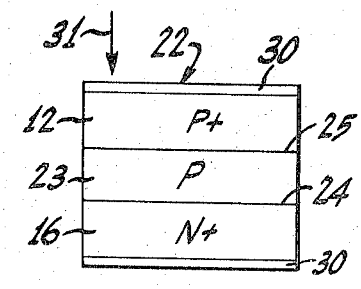

Alternately, as shown in FIG. 2, a pellet 22 can be used containing a heavily doped region 12 of P conductivity type, a highly doped region 16 of N conductivity type, and a lightly doped base region 23 of P type conductivity. The pellet 22 contains two junctions, a PN+ junction 24, and a $P+P$ junction 25.

Figure 3:
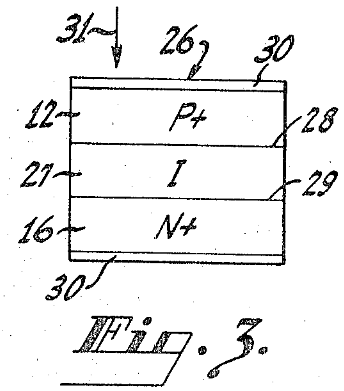

Alternately, as shown in FIG. 3, a pellet 26, similar to the pellets 10 and 22, but containing an intrinsic base region 27, can be used. The pellet 26 contains two junctions, a $P+I$ junction 28, and an $N+I$ junction 29.

Opposite surfaces of each pellet 10, 22, and 26 are provided with ohmic contacts 30, respectively, by means of which voltages can be applied across the pellets.

Means for enclosing the pellets in suitable enclosures are not shown, since such means and enclosures are known.

The pellets 10, 22, and 26, as thus broadly described, are known for use as rectifier diodes. The three pellets 10, 22, and 26, operate in substantially the same manner, the use of either pellet being dependent upon the characteristics desired, as described hereinafter.

In general, the operation of a diode incorporating a pellet 10, 22, or 26 is as follows. During forward conduction of the diode, with the P region 12 biased positive with respect to the N region 16, the concentration of holes and electrons in the base region is greatly increased as holes are injected into the base region 14, 23, or 27, from the P region 12, and electrons are injected into the base region from the N region 16. This is referred to as conductivity modulation of the base region, and results in a conventional current flow in the direction of the arrows 31 in FIGS. 1, 2, and 3, as generally known. When the voltage of the circuit in which the diode is being used is reversed, thus tending to reverse bias the diode, the immediate affect is that the charge carriers in the base region 14, 23, or 27 reverse direction and allow a reverse current to flow. For a short period of time, referred to as the storage time of the diode, the quantity of charge carrier is sufficient to fully sustain the reverse current called for by the circuit and the diode exhibits no blocking characteristics. Eventually, when the number of charge carriers decreases to a quantity insufficient to provide the current called for by the circuit, the diode begins to exhibit a blocking characteristic and the reverse current through the diode begins to decrease.

The rate of decay of the reverse current is known as the recovery rate of the diode.

For the purposes of the present description, a semiconductor diode is said to have a short storage time if the period during which the diode exhibits no blocking characteristic is in the order of, and less than one microsecond. Likewise, a semiconductor diode is said to have a soft recovery characteristic if the recovery rate of the diode is in the order of, and less than one ampere/microsecond, and a snap recovery if in the order of, and greater than 5 amperes/microsecond.

Figures 4, 5:
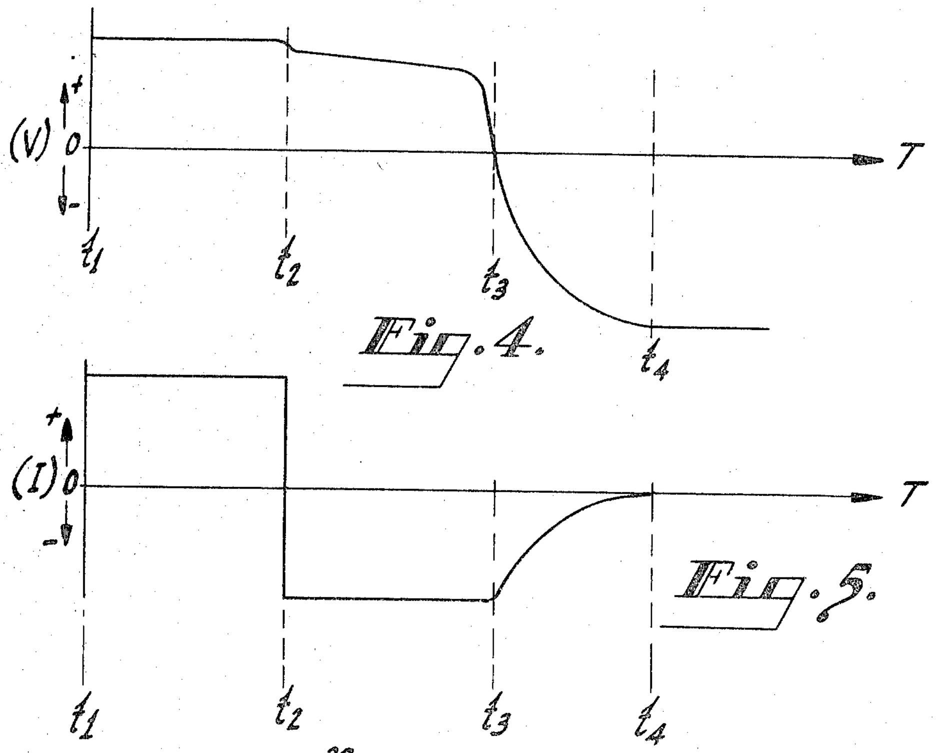
FIGS. 4 and 5 are graphs of voltage and current, respectively, plotted against time, showing the switching characteristics of one semiconductor diode.

The voltage and current waveforms of a given diode, containing a pellet of the types shown in FIGS. 1, 2, or 3, are shown in FIGS. 4 and 5, wherein voltage (V) across the diode, and current (I) through the diode are plotted against time (T), respectively. In each graph, the positive values of voltage and current correspond to a forward voltage across the diode and a forward current through the diode, respectively.

Figure 6:
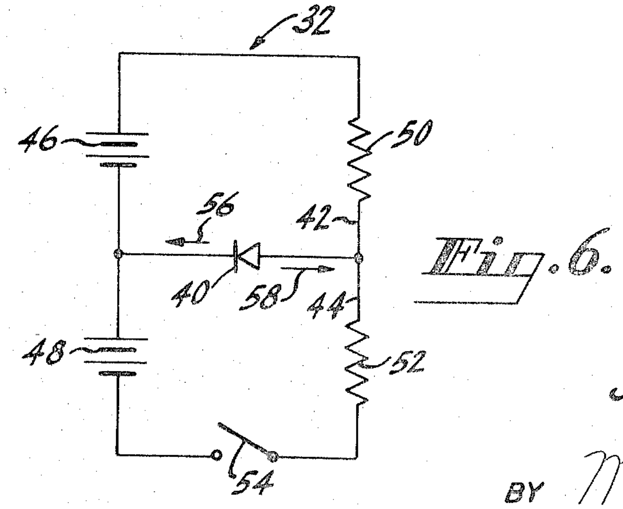
FIG. 6 is a schematic drawing of a circuit used to test the switching characteristics of semiconductor diodes.

The voltage and current waveforms are obtained from the operation of the diode in a typical test circuit 32 of the type shown in FIG. 6. In this circuit, a diode 40 being tested is connected in two current loops 42 and 44, each loop containing a direct current voltage source 46 and 48 of equal magnitude, e.g., 30 volts, and current limiting resistors 50 and 52 of 30 ohms and 15 ohms value, respectively. The loop 44 also contains a switch 54. When the switch 54 is open, the diode 40 is forward biased and a forward current flows through the diode in the direction of the arrow 56. When the switch 54 is first closed, a reverse curent flows through the diode, in the direction of the arrow 58, until the diode begins to block.

With reference to the graphs shown in FIGS. 4 and 5, the diode 40 is in its forward biased state from time $t_1$ to time $t_2$ (the switch 54 in the circuit 32 being in the open position, as shown in FIG. 6), and the voltage across the diode and the current through the diode are both positive. At time $t_2$ the switch 54 is closed and the polarity of the voltage applied to the diode circuit is reversed. Owing to the presence of the charge carriers "stored" in the base region 14, 23, or 27 of the diode pellet, the current through the diode 40 reverses to an amount determined mainly by the magnitude of the applied voltages and the size of the current limiting resistors 50 and 52.

Between times $t_2$ and $t_3$ the reverse current called for by the circuit is fully supplied by the draining of the charge carriers from the pellet. The diode 40 exhibits no blocking characteristic, and the voltage across the diode, as is the case with a discharging capacitor, remains positive (although decreasing) as the diode contributes charge carriers to the circuit.

At time $t_3$ the number of charge carriers is no longer adequate to sustain the flow of reverse current, as demanded by the circuit, and the reverse current begins to decrease. The diode thus begins to block, and a negative blocking voltage begins to build-up across the diode. Subsequent to time $t_3$, the reverse current decays to the normal leakage current level through the diode, which it reaches at time $t_4$, and the reverse voltage across the diode builds up to the circuit bias voltage.

CONTROL OF SWITCHING TIME

In general, the switching time characteristics of semiconductor diodes are affected by the number of stored charge minority carriers, the lifetime of the minority carriers, and the mobility of the minority carries. The greater the number of carriers, generally the greater the storage time of the device. Thus, diodes having thick base regions, capable of storing larger numbers of carriers, are generally used for long storage time devices. The longer the lifetime of the carriers, generally the greater the storage time and the slower the recovery rate of the diode. This follows because the carriers are available for a longer time to contribute to reverse current. The greater the mobility of the carriers, generally the faster the recovery rate of the device. This follows because the carriers diffuse more rapidly out of the base region. Thus, for devices having fast switching characteristics, pellets having P base regions are preferred. In such pellets, the minority carriers in the base region are electrons which have a higher mobility than the minority carriers, holes, in N base region pellets.

In pellets having intrinsic base regions, both holes and electrons are "minority" carriers. Hence, the switching time of such pellets is between that of N and P base type pellets, other things being equal. Intrinsic base region pellets have a higher reverse voltage breakdown capability than either N or P base type pellets, as known, and are thus preferred in applications where high reverse voltage breakdown capabilities, with comparatively thin base regions, are required.

DESIGN PARAMETERS

Several examples, according to the present invention, of means for controlling the switching time characteristics of semiconductor diodes are now given. The effects of the various means described are illustrated by means of graphs showing the current through the diodes plotted against time. The reverse current waveform shown in FIG. 5 is reproduced in each graph, in dashed lines, for purposes of comparison.

Example I

Soft recovery and short storage time characteristics are obtained by the use of a high doping concentration close to the PN, PI, and NI junctions of the various diode pellets. By "close" is meant within a diffusion length of the minority carriers. That is, for the pellet 10 (FIG. 1), having an N base region 14, the doping concentration in the P+ region 12 close to the $P+N$ junction 18 is high, e.g., in excess of $10^{18}$ atoms/cm.$^3$. For the pellet 22 (FIG. 2), having a P base region 23, the doping concentration is high in the N+ region 16 close to the $N+P$ junction 24. For the pellet 26 (FIG. 3), having an intrinsic base region 27, the doping concentration is high in either or (preferably) both the heavily doped regions 12 or 16 adjacent to the junctions 28 or 29, respectively. Means for providing devices having the desired doping concentrations are described hereinafter.

The high doping concentrations contribute to soft recovery and short storage time as follows. The reverse current flow, as stated, is caused by the presence of a reservoir of "stored" charge carriers. During reverse current flow, this reservoir is depleted by outward flow of the charge carriers and by recombination of the carriers. When the charge carriers at the junctions of the pellet are depleted, a depletion layer begins to grow outwardly from both sides of the junction. Charge carriers which diffuse into the depletion layer from adjacent regions are accelerated, by the field of the region, in directions contributing to reverse current. The depletion region itself, however, being generally depleted of charge carriers, behaves as an internal impedance which gives rise to a voltage drop across the depletion region. The voltage drop opposes the circuit driving voltage, thereby causing the current through the circuit, and through the diode, to decrease. Once started, the depletion region sprads rapidly outwardly, thereby further increasing the device impedance and further limiting the reverse current therethrough.

Figure 7:
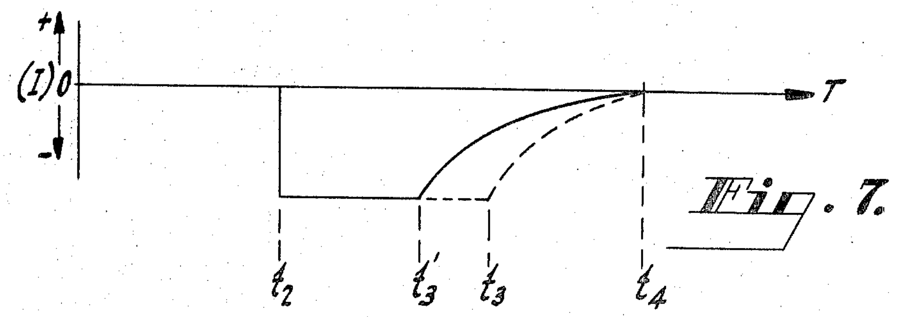
FIGS. 7–10 are graphs of current plotted against time illustrating the affects of the use of various design parameters in accordance with the invention.

An effect of the use of high doping concentrations close to the PN, PI or NI junctions is that the lifetime of the charge carriers close to the junctions is reduced. Thus, during the flow of reverse current, the regions near the PN, PI and/or NI junctions become depleted of charge carriers very rapidly, e.g., at time $t_3'$ (FIG. 7) rather than at time $t_3$. Thus, the storage time of the device is reduced, and the period during which the reverse current decays is increased, thereby contributing to a softer recovery. Further, as the depletion region spreads outwardly (from the $P+N$ junction 18 in the pellet 10; from the $N+P$ junction 24 in the pellet 22; and from either or both the junctions 28 and 29 of pellet 26), the expanding region collects charge carriers in the adjacent portions of the pellet which contribute to reverse current. This further reduces the rate of decay of the reverse current and further contributes to a soft recovery characteristic.

Snap recovery and long storage time diodes are obtained, conversely, by using low doping concentration, e.g., less than $10^{15}$ in the heavily doped regions close to the PN junctions, or either (or both, as explained in Example IV, below) the PI and NI junctions.

Example II

A further means for obtaining soft recovery and short storage time characteristics by means of reducing the lifetime of the charge carriers close to the PN and PI or NI junctions, as described in Example I, is by the provision of appropriate doping materials only in the regions adjacent to these junctions. The use of materials such as gold, platinum, copper, zinc, iron magnesium, or the like, as means for reducing the lifetime of charge carriers is known. Thus, in the pellet 10, the P+ region 12 and the portion of the N base region 14 immediately adjacent to the PN junction 18 are doped with a lifetime killer; in the pellet 22, the N+ region 16 and a portion of the base region 23 adjacent thereto are doped; and in the pellet 26, either the P+ or N+ regions 12 and 16, respectively, and the portion of the base region 27 adjacent to each region, are doped. The presence of the charge carrier lifetime reducing agents only in the regions adjacent to the PN, and PI or NI junctions causes these regions to become quickly depleted of charge carriers while charge carriers are still available in the other, undoped regions of the pellet.

Example III

Another means to obtain soft recovery and short storage time characteristics is the use of an N type base region having as low a resistivity as is possible compatible with other requirements of the device, e.g., reverse voltage blocking capability. As known, when a blocking voltage is applied across a semiconductor diode, a space charge or depletion region is formed having a voltage thereacross equal and opposite to that of the applied voltage. The width of the depletion layer and the rate at which it is formed in the regions on each side of the PN junction are dependent on the doping concentration of the regions.

Figure 8:
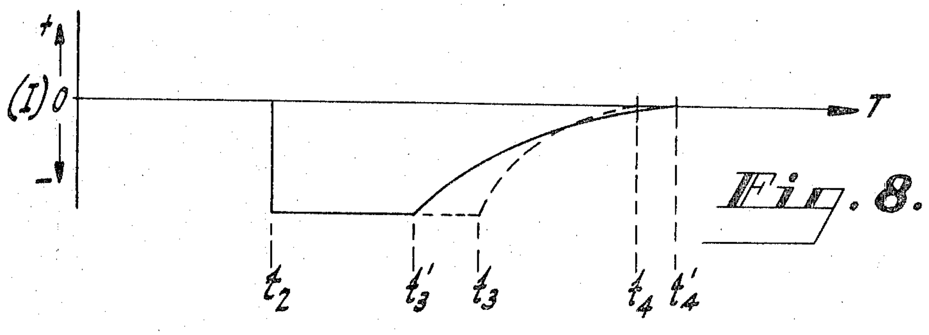

The affect of a low resistivity base region on recovery rate and storage time is illustrated in FIG. 8. Because of the high doping concentration of the base region (to provide the low resistivity thereof), the lifetime of the charge carrires is reduced, hence the quantity of charge carriers available to contribute to reverse current. Thus the storage time of the device is reduced, and the start of reverse current decay occurs at time $t_3'$ rather than at time $t_4'$.

Because of the higher doping concentration, however, the distance which the depletion layer spreads, and the rate at which it spreads, are reduced. The affect of this is that many carriers (holes) available outside the depletion region are not collected by the depletion region as a result of the expansion of the region, but reach it only by the slower process of diffusion. The rate of collection of the charge carriers is thus reduced and the time during which reverse current flows is prolonged to time $t_4'$.

Example IV

A further means to obtain a soft recovery is the use of a low doping concentration, e.g., less than $10^{15}$ atoms/cm.$^3$, in the heavily doped regions close to the $N+N$, $P+P$, and PI or NI junctions (but not both).

Figure 9:
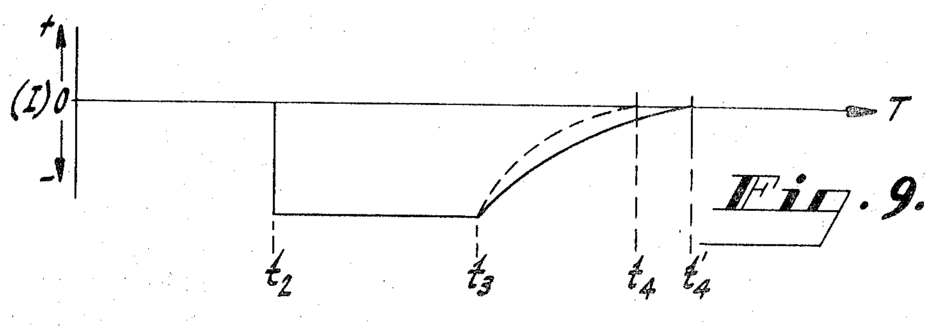

The affect of this is illustrated in FIG. 9. Considering, first, the case of the pellet 10 having an N type base region 14, the low doping concentration in the N+ region 16 close to the $N+N$ junction 20 allows a greater storage (i.e., a higher lifetime) of charge carriers in the N+ region 16 near the junction 20. This has little or no affect on the storage time of the diode, and the decay of the reverse current begins at time $t_3$. During the outward growth of the depletion region, however, the extra carriers stored in the N+ region 16 diffuse into the depletion layer and contribute to reverse current. Further, when the depletion region approaches the $N+N$ junction 20, the rate of growth of the region decreases owing to the heavy doping of the N+ region 16. The carriers in the N+ region 16 continue to diffuse into the depletion layer, however, thereby prolonging the reverse current decay period to time $t_4'$.

Because the affect on recovery time is partially produced by the interaction of the depletion layer and the heavily doped region 16, the use of this design parameter is most effective in those cases where the depletion layer, during reverse bias conditions, spreads substantially all the way across the base region 14.

In the case of the pellet 22 (FIG. 2), the use of a low doping concentration of the P+ region 12 adjacent to the junction 25, or in either the P+ or N+ regions 12 and 16 adjacent to the junctions 28 or 29, respectively, of the pellet 26 (FIG. 3) results, in like manner, in a soft recovery characteristic.

The use of low doping concentrations in both regions 12 and 16 close to the junctions 28 and 29, respectively, of the pellet 26 results in a long storage time and snap recovery. This follows because two depletion layers start, belatedly, at each junction and expand towards one another across the base region 27. When the depletion regions join, the reverse current abruptly ceases.

Figure 10:
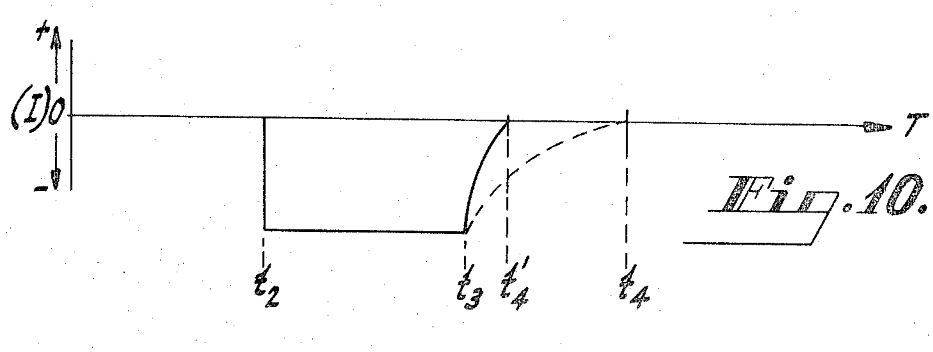

A snap recovery characteristic of the pellets 10 and 22 is obtained by the use of a high concentration close to the $N+N$ or $P+P$ junction 20 and 24, respectively. This allows little storage (i.e., short lifetime) of charge carriers in the N+ region 16 or the P+ region 22, respectively. Thus, as the outwardly expanding depletion region approaches the $N+N$ or $P+P$ junction, the supply of charge carriers decreases rapidly, giving rise to a rapid decrease in reverse current, as illustrated in FIG. 10.

Example V

Reduction of charge carrier storage in the heavily doped region adjacent to the $N+N$ or $P+P$ junction of the pellets 10 or 22, respectively, thereby giving rise to a snap recovery, as described in Example IV, can also be obtained by the use of charge carrier lifetime reducing doping materials, such as gold, or the like, only in the regions adjacent to these junctions.

PREFERRED STRUCTURAL ARRANGEMENTS

Example VI

Figure 11:
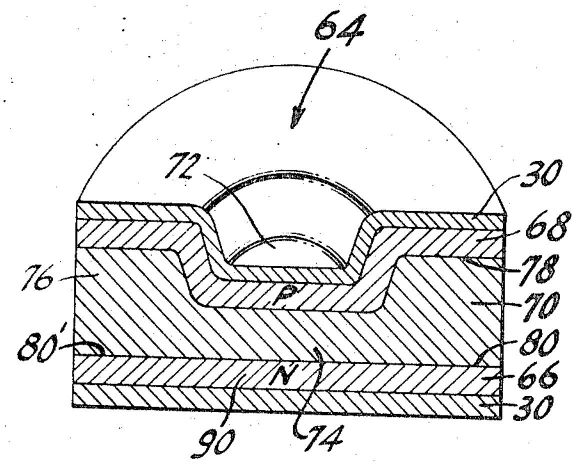
FIGS. 11 and 12 are views in perspective, partly cutaway, of preferred embodiments of semi-conductor diode pellets.

A preferred structural arrangement of the various pellets 10, 22, and 26 is illustrated in FIG. 11. The pellet 64 is a circular disc of a semiconductor material, such as silicon, including an N+ conductivity type region 66, a P+ conductivity region 68, and a base region 70, which is either P type, N type, or intrinsic, as desired. A depression or well 72 is provided in one or othe other sides of the pellet 64 (the P region 68 side of the pellet in the embodiment shown) providing the base region 70 with a thin central section 74 and a thick peripheral section 76. The pellet 64 has two junctions 78 and 80, of a type depending upon the conductivity type of the base region 70. Ohmic contacts 30 are provided on opposite sides of the pellet.

A process for fabricating the pellet 64 is described hereinafter.

An advantage of the pellet 64 construction is that because of the variation in thickness of the base region 70, the depletion layer within the base region can also vary in thickness. That is, in the instance where the reverse bias voltage is sufficiently high to cause the depletion layer to expand entirely across the base region 70, the depletion layer will have substantially the same shape as the base region, i.e., with a central section of smaller thickness than the peripheral sections. An advantage of this is that if the pellet is reverse biased to breakdown, the avalanche process occurs in the center of the pellet rather than at the edges. This is preferred since within the mass of the pellet the avalanche process is less likely to be destructive than if the avalanche process occurs at the surface of the pellet, as known.

The use of the well 72 through one side of the pellet has the further advantage of providing a convenient means of obtaining a thin base region, if desired, while still utilizing a pellet having thick portions (the peripheral portions of the pellet 64) for reasons of greater strength.

Alternately, a pellet 82 (FIG. 12) can be provided with two oppositely disposed central depressions or wells 84 and 86. An advantage of this is that even thinner base regions can be provided.

FABRICATION

Means for fabricating pellets of the type shown in FIGS. 1, 2, and 3 are known. Such means can comprise, for example, starting with a silicon pellet of the conductivity type and resistivity desired in the base region of the pellet. The P+ and N+ regions 12 and 16, respectively, are provided by depositing suitable conductivity modifiers on opposite sides of the pellet and diffusing the modifiers into the pellet.

The diffusion process results in a doping concentration gradient within the pellet. To obtain a high or low doping concentration close to the various junctions, as desired, steep or shallow concentration gradients, respectively, are provided. As known, the concentration gradient is determined by the concentration of the conductivity modifier deposited onto the pellet, and by the depth of the diffusion into the pellet.

The width of the base region is determined by the thickness of the pellet used, and by the depth of the diffusion.

Instead of forming the N+ and P+ regions bp diffusion, these regions can be epitaxially grown, as known. An advantage of this process is that higher concentrations close to the various junctions can be obtained.

The metal contacts 30 are then provided in known manner, as by metal deposition.

Example VII

A method of fabricating the pellet 64 shown in FIG. 11 is now described. Starting with a silicon pellet having the conductivity type and resistivity desired in the base region 70 of the pellet, the centrally disposed well 72 is formed by known means, such as etching. N and P conductivity type modifiers are then deposited onto opposite sides of the pellet, including the inside surface of the well 72, and the pellet is heated to cause the modifiers to diffuse into the pellet to form the N and P regions 66 and 68, respectively. The diffusion of the conductivity modifier into the pellet through the bottom of the well results in the formations of the base region 70 of variable thickness.

The ohmic contacts 30 are then provided in known manner, as by metal deposition.

Figure 12:
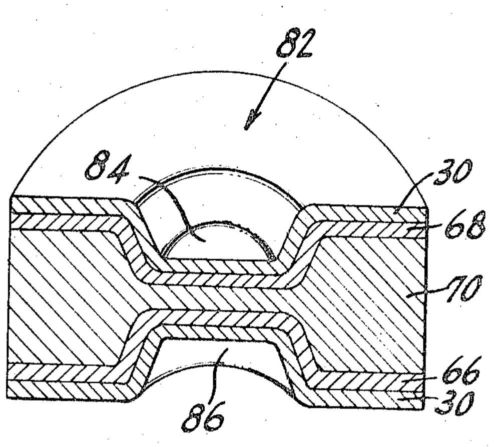

The pellet 82 shown in FIG. 12 can be made in substantially the same manner, except that the two wells 84 and 86 are first formed in the pellet.

Although not described, it is to be understood that in actual preferred practice, in accordance with general practice, a plurality of pellets are fabricated simultaneously on a disc-like wafer of semiconductor material which is then cracked apart to provide the individual pellets.

EXAMPLES OF SPECIFIC DIODE DEVICES

Example VIII

For use in certain horizontal deflection circuits of television receivers, a diode is required having a storage time of less than one microsecond, a reverse voltage rating of a minimum of 800 volts, and a recovery rate sufficiently soft as not to generate noise in the television frequency broadcast band.

Since a relatively soft characteristic is desired, a pellet 64 (FIG. 11) having an N type base region 70 is used. For reasons of cost, the pellet is made by means of diffusion processes. The pellet 64 has a diameter of 80 mils, a thickness of 7 mils, and a well 72 having a depth of 2 mils and a diameter of 50 mils.

Data relating voltage breakdown, base resistivity, and concentration gradients at the PN junction to one another are known.

Using the N type base region pellet, an adequately soft recovery is obtained with a doping concentration in the order of $10^{18}$ atoms/cm.$^3$ within a diffusion length of the PN junction 78. In this embodiment, such a doping concentration is obtained by depositing boron on the surface of the pellet with a surface concentration of about $10^{20}$ atoms/cm.$^3$, and diffusing the boron into the pellet to a depth of about ½ mil.

A base resistivity as low as possible, for reasons of obtaining low power dissipation in the operation of the device, and consistent with the breakdown voltage requirements and the PN concentration gradient selected, comes to about 20 ohm-cm.

The base region 70 is as thin as possible to provide a low forward voltage drop across the device and low power dissipation in the use of the device. For a reverse voltage rating of 800 volts, a minimum base region thickness (i.e., the thickness of the central portion 74 of the base region 70) of about 2 mils is used.

The doping concentration close to the $N+N$ junction 80 is selected for reasons other than the affect thereof on the pellet recovery rate (Example IV). To obtain a good ohmic electrical contact with the surface 90 of the N+ region 66, the surface concentration of the N+ region is preferably around $10^{20}$/cm.$^3$. To simplify the fabrication of the pellet, both the N+ region 66 and the P+ region 68 are formed in the same diffusion process. This results in the $N+N$ junction 80 also being at a depth of about ½ mil, having a concentration close to the junction 80 of about $10^{18}$ atoms/cm.$^3$.

The thin N+ region 66 has the advantage of providing a low voltage drop across the pellet during forward conduction. The doping concentration close to the $N+N$ junction 80 has a relatively small affect on the recovery rate of the pellet 64, and the pellet 64 has a sufficiently soft recovery characteristic for its application.

To obtain a storage time of less than one microsecond, the pellet 64 is doped throughout with gold. Gold doping reduces the charge carrier lifetime, as known, which, as noted above, reduces storage time. Gold doping tends to increase the leakage current through a diode and to increase the forward voltage drop thereacross, hence the gold doping used is the minimum required to obtain the desired storage time. In the instant embodiment, the pellet is doped throughout to the gold saturation level of silicon at 900° C.

Example IX

For use in certain SCR power switching circuits, a diode is required having a reverse blocking voltage rating of 300 volts, a long storage time of 8 microseconds, and a snap recovery greater than 5 amp/microsecond.

Since a long storage time is desired, a pellet similar to the pellet 22 shown in FIG. 2, having a comparatively thick base region 23, e.g., 4 mils, and a comparatively high resistivity of around 20 ohm-cm. is used. Since a snap recovery is desired, a P type base region is used. The pellet is made using diffusion processes. The concentration close to the PN junction 24 is low, being about $10^{15}$ atoms/cm.$^3$. The PN junction is at a depth of about 2 mils beneath the surface of the pellet, and is formed by depositing phosphorus on the surface of the pellet at a concentration of about $10^{20}$ atoms/cm.$^3$, and heating the pellet to diffuse the phosphorus into the pellet.

Alternately, to provide a thinner N+ region 16, for the purpose of reducing the voltage drop thereacross, while still providing a high concentration on the surface of the pellet, for reasons of making a good ohmic contact thereto, the N+ region 16 can comprise two regions (not shown) of different doping concentration gradients. That is, using a low surface concentration of phosphorus, a PN junction having a depth of 2 mils beneath the surface of the pellet and having a low doping concentration close to the PN junction is first formed. Then, the surface concentration of phosphorus is increased by redepositing phosphorus onto the surface of the pellet and diffusing the phosphorus only a short distance into the pellet.

With the base region resistivity and thickness specified, the depletion layer does not extend entirely across the base region at maximum reverse bias, and the doping concentration close to the P+P junction has little affect on the switching characteristics of the device. Hence, it is convenient to form the P+ region 12 in the same diffusion process used to form the N+ region 16, and the doping concentration close to the P+P junction is the same as the doping concentration close to the PN junction.

What is claimed is:

1. A semiconductor diode having a soft recovery and a short storage time switching characteristic comprising:

a silicon pellet containing a highly doped first region of N conductivity type, an N conductivity base region, and a highly doped second region of P conductivity type, said base region being disposed between said first and second regions and forming an *N+N* junction and a *P+N* junction with said first and second regions, respectively;

the doping concentration of N type impurities in said first region close to said *N+N* junction being less than $10^{15}$ atoms/cm.$^3$; and the doping concentration of P type impurities in said second region close to said *P+N* junction being in excess of $10^{18}$ atoms/cm.$^3$.

2. A semiconductor diode as in claim 1 further including a charge carrier lifetime reducing agent in said second region and a portion of said base region adjacent to the junction therebetween.

3. A semiconductor diode having a snap recovery and a long storage time characteristic comprising:

a silicon pellet containing a highly doped first region of N conductivity type, a P conductivity type base region, and a highly doped second region of P conductivity type, said base region being disposed between said first and second regions and forming a PN+ junction and a *P+P* junction with said first and second region, respectively;

the doping concentration of N type impurities in the first region close to the PN+ junction being less than $10^{15}$ atoms/cm.$^3$; and the doping concentration of P type impurities in the second region close to the *P+P* junction being in excess of $10^{18}$ atoms/cm.$^3$.

4. A semiconductor diode as in claim 3 further including a charge carrier lifetime reducing agent in said second region and a portion of said base region adjacent to the junction therebetween.

5. A semiconductor diode having a storage time less than one microsecond, a reverse bias voltage rating of at least 800 volts, and a recovery rate sufficiently soft as to render the diode substantially noiseless in the television frequency broadcast band, said diode comprising:

a pellet of silicon;

said pellet containing a highly doped first region of P conductivity type, a base region of N conductivity type, and a highly doped second region of N conductivity type, said base region being disposed between said first and second regions and forming junctions therewith;

the P and N type impurity concentrations in said first and second regions close to their respective junctions being in the order of $10^{18}$ atoms/cm.$^3$ to provide the desired recovery rate;

said base region having a width of about 2 mils, and a resistivity in the order of 20 ohm-cm; and a charge carrier lifetime reducing agent throughout said first, second, and base regions to provide the storage time characteristic.

6. A semiconductor diode as in claim 5 wherein only said first region and a portion of said base region adjacent thereto are doped with a lifetime reducing agent of gold.

7. A semiconductor diode having a storage time of at least eight microsconds, a reverse blocking voltage rating of at least 300 volts, and a recovery rate of greater than 5 amperes per microsecond, said diode comprising:

a pellet of silicon;

said pellet containing a highly doped first region of P conductivity type, a base region of P conductivity type to provide a long storage time, and a highly doped second region of N conductivity type, said base region being disposed between said first and second regions and forming junctions therewith;

said junctions being at a depth of about 2 mils beneath opposite surfaces of said pellet, and the P and N type impurity concentrations in said first and second regions close to their respective junctions being in the order of $10^{15}$ atoms/cm.$^3$ to provide the snap recovery characteristic; and said base region having a width of about 4 mils and a resistivity in the order of 20 ohm-cm.

8. A semiconductor diode as in claim 7 wherein only said second region and a portion of said base region adjacent thereto are doped with a lifetime reducing agent.

References Cited

UNITED STATES PATENTS 3,419,764 12/1968 Kasugai et al. ________ 317—234

3,428,870 2/1969 Davis _______________ 317—234

JOHN HUCKERT, Primary Examiner

M. H. EDLOW, Assistant Examiner